(12) United States Patent
Belke, Jr. et al.

(10) Patent No.: US 6,326,241 B1
(45) Date of Patent: Dec. 4, 2001

(54) SOLDERLESS FLIP-CHIP ASSEMBLY AND METHOD AND MATERIAL FOR SAME

(75) Inventors: Robert Edward Belke, Jr., W. Bloomfield; Brian John Hayden, Royal Oak; Cuong Van Pham, Northville; Rosa Lynda Nuno, Canton; Michael George Todd, South Lyon, all of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 08/999,153

(22) Filed: Dec. 29, 1997

(51) Int. Cl.[7] ................................................. H01L 21/44
(52) U.S. Cl. ..................... 438/118; 438/108; 438/612
(58) Field of Search ................................... 438/108, 118, 438/119, 612

(56) References Cited

U.S. PATENT DOCUMENTS

| | | |
|---|---|---|
| 5,074,947 | 12/1991 | Estes et al. . |
| 5,111,279 | 5/1992 | Pasch et al. . |
| 5,168,346 | 12/1992 | Pasch et al. . |
| 5,196,371 | 3/1993 | Kulesza et al. . |
| 5,206,186 | 4/1993 | Neugebauer et al. . |
| 5,458,694 * | 10/1995 | Nuyen ................................. 438/118 |
| 5,578,527 | 11/1996 | Chang et al. . |
| 5,611,884 | 3/1997 | Bearinger et al. . |
| 5,625,230 | 4/1997 | Park et al. . |
| 5,783,465 * | 7/1998 | Canning et al. ..................... 438/118 |
| 5,795,818 * | 8/1998 | Marrs ................................... 438/612 |
| 5,863,815 * | 1/1999 | Egawa ................................. 438/118 |

* cited by examiner

Primary Examiner—Kevin M. Picardat
(74) Attorney, Agent, or Firm—Mark Mollon

(57) ABSTRACT

A solderless method for assembling a semiconductor electronic flip-chip device to an electrical interconnecting substrate including the steps of forming a plurality of raised electrical contacts and plurality of contact pads. The pads correspond in number and physical location with the electrical contacts. The pads and contact mate when brought together. A quantity of plastic material is interposed between the electrical device and substrate. The plastic material is heated so that it softens and flows. The electronic device and substrate are urged together. The urging step displaces the molten plastic material from between the contacts and pads. The contacts and pads are jointed directly without any adhesive, solder or conducive filler therebetween to electrically interconnect the electronic device and substrate. The plastic material is allowed to cool whereby the electronic device and substrate are adhesively bonded together and electrically interconnected.

10 Claims, 2 Drawing Sheets

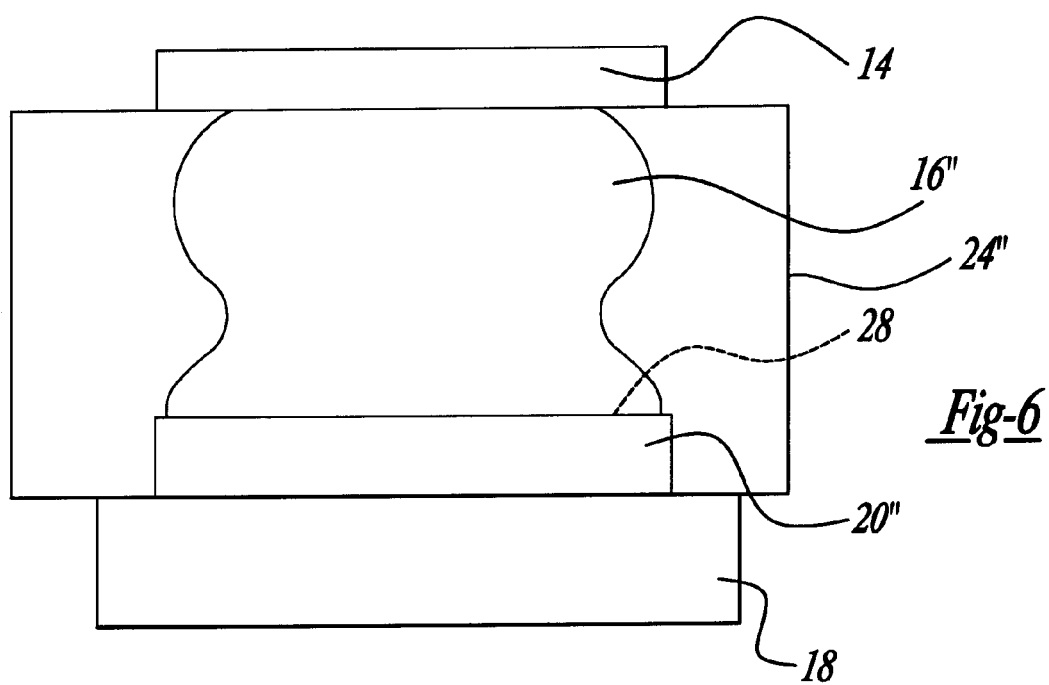

SOLDERLESS FLIP-CHIP ASSEMBLY AND METHOD AND MATERIAL FOR SAME

FIELD OF THE INVENTION

The present invention is directed to semiconductor devices and, more specifically, to solderless flip-chip semiconductor devices and to methods for making such flip-chip semiconductor devices.

BACKGROUND

Flip-chip semiconductor devices are well known in the electronics industry, in which a typically packageless semiconductor device, such as an integrated circuit, etc., is mounted to a substrate, such as a printed circuit board (PCB) or printed wiring board (PWB), in a die-down or face-down position, that is, with the electrical interconnects facing downward toward the substrate. That is, an active surface of a semiconductor die is mounted facing the substrate, typically by bonding a plurality of conductive bumps, for example, solder bumps on the interconnect pads of the active surface, to corresponding electrical terminals on the mounting surface of the substrate. The electrical connections between the semiconductor die and the substrate are thereby confined to an area not exceeding the size of the die, i.e., its so-called footprint size.

In order to achieve a structurally robust and environmentally resistant attachment of the flip-chip device to the substrate, it is known to use an undercoat adhesive, typically a thermosetting epoxy adhesive, sandwiched between the active face of the flip-chip device and the underlying mounting surface of the substrate. The epoxy is placed in an uncured state around the periphery of the flip-chip device after electrical connection has been established. The epoxy wicks by capillary action to at least partially fill the cavity between the flip-chip device and the substrate, following which it is cured in an oven or the like. Substantial assembly complexity is incurred in carrying out this undercoating operation. In addition, the amount of low cost, low expansion filler, such as $SiO_2$, which can be added to the thermosetting epoxy is limited by the need to maintain a sufficiently flowable rheology.

Most flip-chip devices use solder to connect the flip-chip to the substrate. Soldering has the disadvantage of requiring post assembly heating to cause the solder to melt and flow. This heating may damage substrates that are not capable of withstanding high temperature exposure. These substrates melt, soften or degrade at between 100° C. and 350° C. Additionally, soldering causes the flip-chip devices to be fixed to multiple points on the substrate. These points are subject to stress when the flip-chip undergoes thermal expansion and contraction. The flip-chip device is usually made of silicon and has a thermal expansion coefficient of ~3 ppm/° C. When using thermoplastic substrates, the thermal expansion coefficient is between 15 and 150 ppm/° C. Repeated cycling from hot to cold causes the substrate and flip-chip device to expand and contract at very different rates and causes stress and fatigue on the solder connection resulting in interconnection crack failure and electrical failure. Also, solder often contains lead and other materials such as fluxes. Regulations preclude or limit lead and fluxes must be removed prior to applying adhesives. Residual traces of flux may damage or degrade the connection.

Several U.S. patents show adhesively bonding the flip-chip to the substrate. Most have used conductive particles or conductive adhesive between the flip-chip device and substrate. U.S. Pat. Nos. 5,578,527 and 5,611,884 are examples which teach placing conductive particles in the adhesive. In the case of the U.S. Pat. No. 5,611,884 patent, the conductive particles must be precisely aligned with the flip chip and substrate and are affixed using a conductive adhesive. Care must be taken to avoid electrically interconnecting adjacent interconnects. In the case of the U.S. Pat. No. 5,578,527 patent, a film having uniformly dispersed conductive particles is applied between the flip-chip device and substrate. The particles are trapped between the flip-chip and substrate. The difficulty arising in placing the particles in close enough spacing to be trapped between the flip chip and substrate but not too close so as to electrically connect adjacent interconnects. Use of conductive particles and conductive adhesives is expensive and complex. Furthermore, the use of conductive particles limits the electrical joint to very low current carrying and low temperature operation. The particle to particle contact is essentially a point contact with only a very limited surface contact that cannot support high currents. Electrical connection through the particles is limited to a narrow temperature range because thermal expansion of the adhesive tends to cause the particles to separate.

Another disadvantage of current flip-chip undercoat technology is the inability to repair or replace the flip-chip device following adhesive cure. Flip-chips with soldered interconnects must be heated to the solder melting point. This heating may damage the components or the substrate. The flip-chips with thermoset adhesives do not melt and do not easily allow replacement of a defective flip-chip.

It is an object of the present invention to provide solderless flip-chip assemblies that have good performance characteristics. It is a particular object of at least certain preferred embodiments to provide repairable flip-chip assemblies and methods for the reversible assembly of flip-chip devices to electrical interconnecting substrates. These and additional objects and features will be apparent from the following disclosure of the invention and detailed description of certain preferred embodiments.

SUMMARY

The invention includes a solderless method for assembling a semiconductor electronic flip-chip device to an electrical interconnecting substrate. The method includes the steps of forming a plurality of raised electrical contacts made from a compressible metal on said device. The compressible metal may be an elemental metal such as gold, or a metal alloy. A plurality of contact pads are formed on the substrate. The pads correspond in number and physical location with the electrical contacts. The pads and contacts mate when brought together. A quantity of electrically insulating plastic material is interposed between the electrical device and substrate. The plastic material is heated if necessary so that it softens. The electronic device and substrate are urged together under temperature and pressure. The urging step displaces some plastic material from between the contacts and pads. The contacts and pads are brought into direct contact without any adhesive, solder or conducive filler therebetween to electrically interconnect the electronic device and substrate. Thermoplastic plastic materials cool and solidify. Thermoset plastic materials cross-link and cure. The electronic device and substrate are adhesively bonded together and electrically interconnected. The plastic material tends to shrink and tends to draw the electronic device and substrate together to assure a reliable electrical contact.

The invention also includes an electronic device formed by the methods taught. The flip-chip is directly attached to the substrate without the need for solder, conductive adhesive or intermediate conductive particles. The assembly may utilize relatively low-cost and lightweight moldable thermoplastic substrates that would otherwise be unsuitable for soldering. The device is also capable of withstanding repeated thermal expansions without "fatigue type" failures because the connection between the electronic device and substrate is a contact type rather than a fixed soldered interconnect.

The invention also enables the repair of flip-chip devices made by the construction taught. The flip-chip may be easily replaced by heating the plastic material to a temperature sufficient to cause it to soften and flow. The old flip-chip may be removed without damaging the substrate. The temperature needed to reflow the plastic material is generally between 150° C. and 300° C. and does not damage the surrounding components or the underlying substrate.

It will be recognized by those skilled in the art, that is, those who are knowledgeable and experienced in this area of technology, that the present invention is a significant technological advance. Particularly in the case of certain preferred embodiments, significant improvements and advantages are achieved. Relatively rapid flip-chip assembly can be achieved, for example, using a preform of the plastic material positioned between the flip-chip device and the substrate surface, followed by heating to above the glass transition temperature ($T_g$) or melting temperature of the plastic material. In such embodiments and also in alternative embodiments in which the plastic material is interposed between the substrate and the flip-chip in a molten state, there is no need for the step of oven curing, as in the case of prior known epoxy or other thermosetting undercoat materials.

Additional features and advantages will be recognized by those skilled in the art in connection with the following detailed discussion of certain preferred embodiments.

BRIEF DESCRIPTION OF THE DRAWINGS

Certain preferred embodiments will be described in further detail below in connection with the appended drawings wherein:

FIG. 6 is a schematic side view of a flip-chip assembly of illustrating the onion-shaped bump of FIG. 4 as an integrated structure subsequent to bonding;

Figure 1:
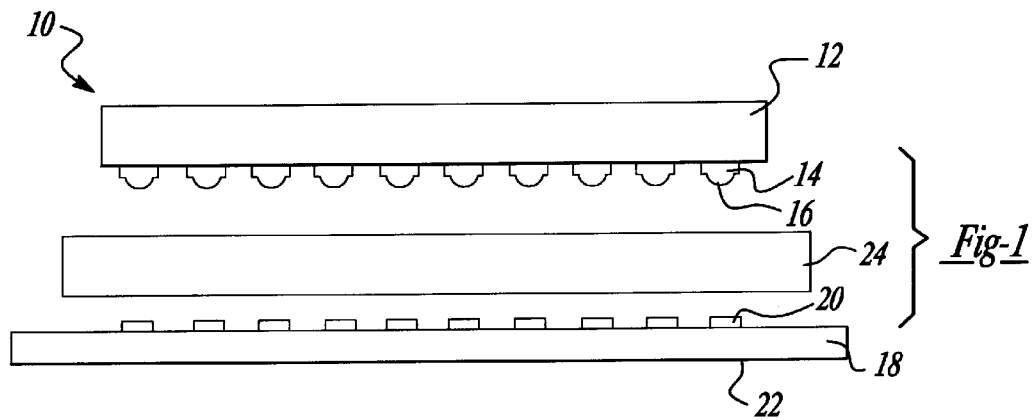
FIG. 1 is a schematic side view of a flip-chip assembly having spherically-shaped bumps prepared for bonding.

It should be understood that the above mentioned drawings have been simplified in some respects for clarity. In addition, the dimension of certain features or elements has been modified for ease of illustration. For example, the plastic material adhesive preform best seen in FIG. 1, is illustrated with greater relative thickness than would be used in most applications. In general, design features will depend primarily on the particular application for which the finished assembly is intended. It will be well within the ability of those skilled in the art, given the benefit of the present disclosure, to select such design features to meet the needs of particular applications and for particular intended use environments.

DETAILED DESCRIPTION OF CERTAIN PREFERRED EMBODIMENTS

In accordance with the method disclosed above for assembly of a semiconductor electronic flip-chip device to an electrical interconnecting substrate, a non-conductive plastic material is interposed between the active face of the flip-chip device and the attachment or bond site on the surface of the substrate. The flip-chip is then bonded to the substrate, involving the plastic material either undergoing viscous flow at a temperature above its glass transition ($T_g$) temperature or its melting point temperature. It should be understood that as the term is used here, viscous flow includes viscoelastic flow. Certain preferred plastic materials suitable for use in the disclosed method do not crystallize and, therefore, do not melt in the strict sense of the word, but rather become viscoelastic at temperatures above their $T_g$ temperature. In accordance with one preferred embodiment, the plastic material is interposed between the flip-chip device and the substrate by placing onto the optionally preheated substrate a preform of the plastic material. More particularly, the preform preferably is in the form of a substantially uniformly thick film. The film can advantageously be die-cut from a larger sheet of the plastic material, and generally will have a thickness between 50 and 150 $\mu$m, most preferably about 100 $\mu$m. The thickness will depend largely on the particular assembly operation and on the configuration, size, etc., of the flip-chip device and substrate bonding site. The lateral size of the preform, that is, its dimensions in a plane parallel to the surface of the substrate, typically will correspond closely to the die size of the flip-chip device to be bonded to the substrate.

The present invention will be described through a series of drawings, the manufacture of a flip-chip device on a substrate. Other components such as integrated circuit, power die, capacitors, diodes and resistors may be manufactured using the same or similar technique and equipment and are included within the invention described herein. The following items are a word list of the items described in the drawings and are reproduced to aid in understanding the invention:

| | |
|---|---|
| 10 | solderless flip chip assembly |
| 12, 12' | flip-chip device |
| 14, 14' | electrical bonding pads |
| 16, 16' 16", 16''' | compressible metal or gold bumps |
| 18, 18' | circuit board substrate |
| 20, 20' | electrical contact pads |
| 22 | plastic backing |
| 24, 24', 24" | adhesive layer |
| 25 | fillet |
| 26 | point |
| 28 | interfacial layer |

Illustrated in FIG. 1 is a sectional view of a solderless flip-chip assembly 10. The assembly 10 includes a solid state flip-chip device 12. The flip-chip 12 is of the type normally used in the construction of electronic assemblies. A typical flip-chip device includes silicon die with electrically conductive bonding pads usually made from aluminum. The flip-chip includes electrical bonding pads 14 and bumps 16 that provide the electrical inputs and outputs to the flip-chip 12. The bumps 16 are typically made of gold, silver or palladium as well as metal alloys. As will be more fully described below, the bumps are spherically-shaped and applied to each electrical bonding pad to provide a standoff for the flip-chip 12. The flip-chip device 12 is connected to an electronic circuit board substrate 18. The substrate 18 may be a traditional fiber-reinforced, injection molded or ceramic rigid board or may alternatively be a flexible circuit board. The substrate 18 include a number of bonding pads 20 usually made of Au, Pd, Pt, Ag, or Cu that align with the bumps 16. The electrical contact pads 20 are connected to electrical traces (not shown), that connect the flip-chip device 12 to other components. The contact pads 20 are secured to a plastic backing 22.

Unlike traditional flip-chip devices, the present invention does not utilize reflow solder joints to interconnect the flip-chip to the substrate. Rather, the flip-chip 12 is bonded to the substrate 18 with a non-electrically conductive adhesive layer 24. A number of suitable adhesive materials maybe used in the present invention and may include those disclosed in commonly assigned U.S. patent application titled "Repairable Flip-Chip Undercoating Assembly and Method and Material For Same", Ser. No. 08/554,181, filed Nov. 6, 1995, and incorporated herein by reference. The adhesive material should be non-conductive with a high dielectric and display a low alpha particle emission. While both liquid and solid phase material maybe used for the adhesive layer 24, especially preferred are solid phase materials cut into sheets slightly larger than the dimension of the flip-chip device 12. Solid phase adhesive materials suitable in the present invention include epoxy film with silica particles LF69506-6 manufactured by Dexter-Hysol Corporation and silica filled polyaryletherketones as well as other non-electrically conductive plastic materials. As will be more fully described below, the adhesive layer 24" is selected from materials that provides a coefficient of thermal expansion (CTE) that is approximately between the CTE of the flip-chip 12 and the plastic backing 22 and provides appropriate thermal properties.

By placing the layer 24 between the substrate 18 and the flip-chip 12, the electrical connection is completely protected from environmental damage and contamination including oxidation of the electrical contacts. The adhesive connection also distributes the stress of thermal expansion more evenly between the substrate 18 and flip-chip 12 than a fixed connection.

EXAMPLE 1

A flip-chip 12 made of Si having a CTE of 3 ppm/°C. and 112 electrical bonding pads 14 is attached to and electrically connected with a substrate 18. The bonding pads 14 are made of aluminum. A spherical gold bump is applied to the each bonding pad 14. The gold may be deposited in a molten state as a droplet. The surface tension of the material forms a spherical shape. Gold is selected for the bump because it highly conductive, resistant to oxidation and deformable.

Figure 2:
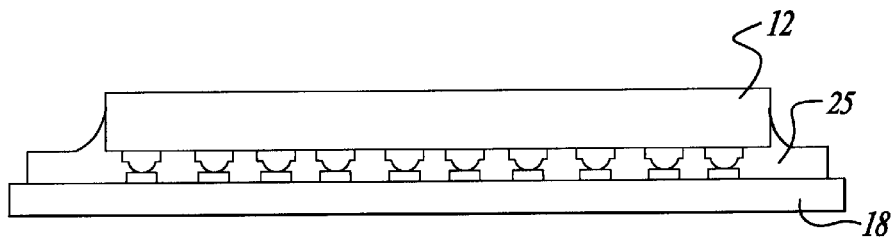
FIG. 2 is a schematic side view of the flip-chip assembly of FIG. 1 as an integrated structure subsequent to bonding.

Polyaryletherketone having 40% $SiO_2$ fill was used for adhesive layer 24. Adhesive layer 24, 100 $\mu$m thick and slightly larger than the flip-chip 12 was placed between the flip-chip 12 and the substrate 18. The adhesive layer 24 was heated by the flip-chip substrate support table (not shown) to approximately 75° C. until the adhesive layer 24 became softened. The flip-chip 12 was heated to 200° C. and was pushed through the adhesive layer 24 to contact the substrate 18. The flip-chip 12 approach speed was 30,000 microns/step until it makes contact with the adhesive layer 24 and then the flip-chip 12 is pushed through the adhesive layer 24 at a rate of 1000 microns/step until it makes contact with the substrate 18. It then continues at a rate of 6.5 microns/sec until the flip-chip 12 applies a force of about 100 grams/bump against the substrate 12. Pressure is applied for between 10–30 seconds. The adhesive layer 24 has a melting point of about 156° C. and melts when contacted with the flip-chip 12. The bumps 16 displace the adhesive from between the bumps 16 and the contact pads 20 and provide an electrical interconnect between the flip-chip 12 and the substrate 18. The adhesive layer 24 is compressed to about 60 $\mu$m and forms a fillet 25 around the perimeter of the flip-chip 12 as illustrated in FIG. 2. As the adhesive cools, it shrinks between 3–5% and draws the flip-chip 12 against the substrate 18. The gold bumps 16 contact the pads 20 and provide a good electrical interconnection between the flip-chip 12 and the substrate 18. The adhesive layer 24 adhesively attaches the flip-chip 12 to the substrate 18 and encases the bumps 16 and prevents oxidation or contamination which may degrade the electrical connectivity. The adhesive layer 24 also acts to provide a buffer between the larger CTE of the substrate 18 and the very low CTE of the flip-chip 12. Dimensional changes due to thermal cycling are absorbed by the adhesive layer 24 and do not place stress on the interconnect. This enables the use of low-cost, light-weight thermoplastic materials for the plastic backing 22. The assembly 10 as described may be easily repaired by heating the adhesive layer 24 to about 250° C. and replacing the flip-chip 12.

EXAMPLE 2

Figure 3:
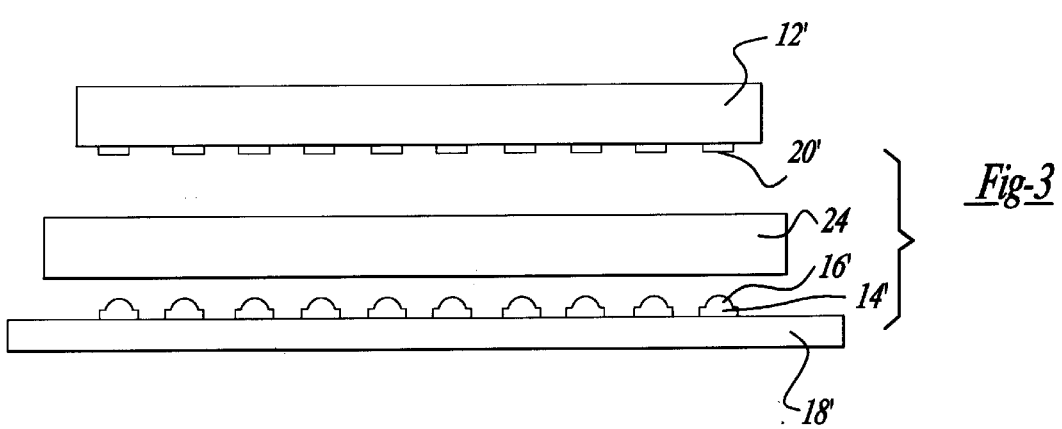
FIG. 3 is a schematic side view of an alternative embodiment of a flip-chip assembly having spherically-shaped bumps on the substrate.

The method as described and illustrated in Example 1 above teaches placing the gold bumps 16 on the flip-chip device. The invention may also be practiced by placing the bumps 16' on the substrate 18' as illustrated in FIG. 3. In this embodiment, the gold bumps 16' are formed on electrical bonding pads 14'. The flip-chip device 12' is formed with contact pads 20' that connect with the bumps 16'. A thixotropic liquid, uncured epoxy adhesive manufactured by Dexter-Hysol, Corporation, 4451 was applied as a gel-like at room temperature between the bumps 16' and the contact pads 20'. The flip-chip 12' and adhesive 24' were heated to about 200° C. The flip-chip 12' was pushed through the adhesive 24' at a rate of 30,000 microns/step until it makes contact with the bumps 16' and then pushed at a velocity of 1000 microns/step until the flip-chip applies a force of approximately 100 grams/bump. The cured adhesive shrinks between 5–10% and provide a very strong bond between the flip-chip 12' and substrate 18'.

EXAMPLE 3

The process described in the forgoing Examples 1 and 2 illustrate a contact connection between the flip-chip and the substrate. The invention may also be used to provide a more secure solderless bond between the flip-chip and the substrate. This process brings together ductile materials such as gold under conditions of heat and pressure, a metal to metal bond (diffusion bond) may be formed were the gold atoms from the pad and bump interdefuse to form a continuous and seamless connection. The process described in this Example 3 may be used in situations were the quality and reliability of the interconnection is more important than reparability.

Figure 4:
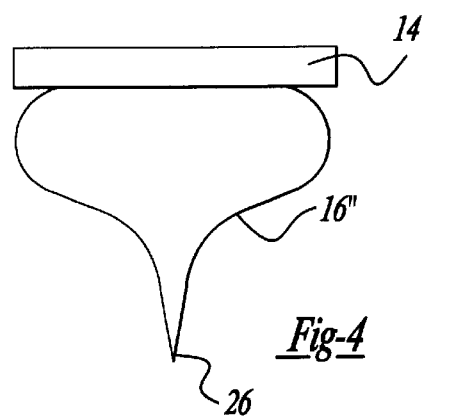
FIG. 4 is a schematic side view of another alternative embodiment having an onion-shaped bump.
Figure 5:
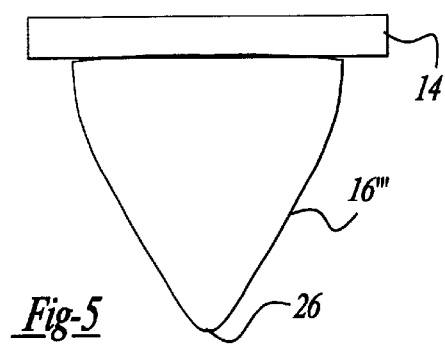
FIG. 5 is a schematic side view of yet another alternative embodiment having a conical bump.

The process of this Example 3 will be illustrated in FIGS. 4–6. A gold bump having either a onion-like shape 16" illustrated in FIG. 4, or a conical shape 16''' illustrated in FIG. 5 is formed by a fine wire bonding process. The end of a gold wire having a diameter of between 1–2 mils is melted to form a ball. The fine wire ball is then thermosonically contacted and bonded to each bonding pad 14. As the wire is pulled away from the pad, it elongates and breaks at a point 26. The bump 16", 16'" has a diameter of between 3–4 mils and a height of between 2–3 mils. The bump 16", 16'" are bonded to the underlying bonding pad 14. The bumps 16", 16'" may be closely spaced and allow for a more compact flip-chip device.

The conical or onion-like shape better enables the bump to pass through the adhesive layer without entrapping adhesive between the bump and the contact pad.

A silica particle filled epoxy film adhesive layer 24", 100 μm thick was placed between the flip-chip and the substrate as shown in FIG. 6. The adhesive layer 24" was heated to 75° C. prior to contact with the flip-chip. The flip-chip was heated to 325° C. and pushed through the adhesive layer 24" at a rate of 30,000 microns/step until it contacts the substrate 18. After this contact, the flip-chip is pushed at a rate of 1000 microns/step until the flip-chip applies a force of 250 g/bump against the substrate 18.

The point 26 of the bump 16" penetrates the adhesive layer 24" without entrapping adhesive material and directly contacts contact pad 20" as illustrated. FIG. 6 is an illustration of the onion-like bump 16" shown in FIG. 4 after bonding with contact pad 20". The contact pad 20" is preferably made of the same or similar material as bump 16". The heat and pressure applied to the flip-chip causes the bump 16" to deform and spread across the contact pad 20". The adhesive layer 24" is displaced from between the contact pad 20" and the bump 16". The cured adhesive layer 24" shrinks about 5–10%. The interfacial layer 28 is a continuous interdefusion of gold atoms from both the bump 16" and the pad 20" forms a reliable electrical interconnect between the flip-chip and substrate. The interconnect formed by the process described in this Example 3 has a very high reliability and withstands thousands of thermal cycles without failure. Because the interconnect is made from a continuous metal, it is less prone to fatigue failures caused by work hardening as commonly experienced in solder joints.

It is thus seen that the objects of this invention have been fully and effectively accomplished. It will be realized, however, that the foregoing preferred embodiments have been shown and described for the purpose of illustrating the functional and structural principles of this invention and are subject to change and modification by those skilled in the art without departing from the principles described. Therefore, this invention includes all modifications encompassed within the spirit and scope of the following claims:

We claim:

1. A solderless method for assembling a semiconductor electronic flip-chip device to an electrical interconnecting substrate, comprising the steps of:

forming a plurality of raised electrical contacts made from a compressible metal on said device; forming a plurality of contact pads on said substrate, said pads mating with said contacts;

interposing a non conductive plastic material between said device and substrate;

heating said plastic material sufficient to cause said plastic material to soften and flow;

urging said device and substrate together and displacing said plastic material from between said contacts and pads;

contacting said contacts directly with said pads and forming an electrical connection between said device and substrate; and cooling said plastic material whereby said device and substrate are adhesively bonded together and electrically interconnected.

2. The method of claim 1 wherein the plastic material has a glass transition temperature between 150° C. and 240° C. and a composite coefficient of thermal expansion between 5 and 40 ppm/°C.

3. The method of claim 1 wherein the plastic material is interposed between the flip-chip device and the substrate by placing thereon a preform film of the plastic material, followed by positioning the flip-chip device onto the substrate over the preform film and then forming a bonded assembly by applying heat and pressure to substantially simultaneously flow the preform film and establish electrical connection between the flip-chip device and the substrate.

4. The method of claim 1, wherein the plastic material is interposed between the flip-chip device and the substrate in a viscous state.

5. The method of claim 1, wherein said raised electrical contacts are bumps each having a point and said urging step swiftly presses said device against said substrate and said points contact said contact pads.

6. The method of claim 5, wherein said bumps interdefuse with said contact pads.

7. The method of claim 6, wherein said bumps and contact pads are made of gold.

8. The method of claim 1, further comprising re-heating said plastic material sufficient to cause said plastic material to soften and flow and removing said device from said substrate.

9. A solderless method for assembling a semiconductor electronic flip-chip device to an electrical interconnecting substrate, comprising the steps of:

forming a plurality of contact pads on said device;

forming a plurality of raised electrical contacts on said substrate, said contacts mating with said pads;

interposing a plastic material between said device and substrate;

heating said plastic material sufficient to cause said plastic material to soften and flow;

urging said device and substrate together and displacing said plastic material from between said contacts and pads;

contacting said contacts directly with said pads and forming an electrical connection between said device and substrate; and cooling said plastic material whereby said device and substrate are adhesively bonded together and electrically interconnected.

10. The method of claim 9, wherein said raised electrical contacts are gold bumps each having a point and said urging step swiftly presses said device against said substrate and said points contact said contact pads, further comprising applying pressure between said substrate and said device to cause said bumps and pads to interdefuse and bond.

* * * * *